US009280454B1

(12) United States Patent
Elsasser et al.

(10) Patent No.: US 9,280,454 B1
(45) Date of Patent: Mar. 8, 2016

(54) METHOD AND SYSTEM FOR RE-ORDERING BITS IN A MEMORY SYSTEM

(75) Inventors: Wendy Elsasser, Austin, TX (US); Marc Greenberg, Austin, TX (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 130 days.

(21) Appl. No.: 13/410,767

(22) Filed: Mar. 2, 2012

(51) Int. Cl.
*G06F 13/00* (2006.01)
*G06F 11/00* (2006.01)
*G06F 12/00* (2006.01)
*G11C 7/00* (2006.01)
*G06F 13/28* (2006.01)

(52) U.S. Cl.
CPC .............. *G06F 12/00* (2013.01); *G06F 13/28* (2013.01); *G11C 7/00* (2013.01)

(58) Field of Classification Search
CPC . G06F 12/0246; G06F 11/10; G06F 12/1027; G06F 11/0772; G06F 11/1012; G06F 11/1048; G06F 3/0683; G06F 3/0689; G06F 5/065; G06F 9/06
See application file for complete search history.

(56) References Cited

U.S. PATENT DOCUMENTS

| 8,401,138 | B2* | 3/2013 | Hayasaka et al. | 375/355 |
| 8,437,209 | B2* | 5/2013 | Song | 365/201 |
| 8,638,931 | B2* | 1/2014 | Isaac | 380/210 |
| 2011/0078370 | A1* | 3/2011 | Chaudhuri et al. | 711/105 |
| 2011/0153925 | A1* | 6/2011 | Bains et al. | 711/105 |

OTHER PUBLICATIONS

DDR4 Mini Workshop (Link: http://www.jedec.org/sites/default/files/JS_Choi_DDR4_miniWorkshop.pdf), Server Memory Forum 2011.*
New features of DDR3 SDRAM, Elpida, Mar. 2009, 1-18.*
JEDEC Solid State Technology Association, JEDEC Standard, DDR4 SDRAM, JESD79-4, JEDEC Standard No. 79-4, 4.10 Multi Purpose Register, Sep. 2012, pp. 37-47.
JEDEC Solid State Technology Association, JEDEC Standard, DDR4 SDRAM, JESD79-4, JEDEC Standard No. 79-4, 4.16 CRC, Sep. 2012, pp. 61-68.

* cited by examiner

*Primary Examiner* — Mark Giardino, Jr.
*Assistant Examiner* — Mohamed Gebril
(74) *Attorney, Agent, or Firm* — Sawyer Law Group, P.C.

(57) ABSTRACT

A method and system for re-ordering bits in a memory system is disclosed. The memory system includes a system on a chip (SoC) coupled to a plurality of memory chips. Each of the memory chips including a memory array, multipurpose registers (MPRs) coupled to the memory array; and a data bus coupled between the SoC and the memory array. The method and system comprise utilizing the MPRs within each of the plurality of memory chips to determine bit ordering within each byte lane of memory array of the associated memory chip. The method and system further includes providing the determined bit ordering to the SoC.

12 Claims, 8 Drawing Sheets

High Level Block Diagram

| DQ | Burst Unit Interval (UI) | | | | | | | |
|---|---|---|---|---|---|---|---|---|
| | 0 | 1 | 2 | 3 | 4 | 5 | 6 | 7 |
| 0 | 0 | 0 | 0 | 0 | 0 | 0 | 0 | 0 |
| 1 | 0 | 0 | 0 | 0 | 0 | 0 | 0 | 0 |
| 2 | 1 | 1 | 1 | 1 | 1 | 1 | 1 | 1 |
| 3 | 0 | 0 | 0 | 0 | 0 | 0 | 0 | 0 |
| 4 | 0 | 0 | 0 | 0 | 0 | 0 | 0 | 0 |
| 5 | 0 | 0 | 0 | 0 | 0 | 0 | 0 | 0 |
| 6 | 0 | 0 | 0 | 0 | 0 | 0 | 0 | 0 |
| 7 | 0 | 0 | 0 | 0 | 0 | 0 | 0 | 0 |

| DQ | Burst Unit Interval (UI) | | | | | | | |
|---|---|---|---|---|---|---|---|---|
| | 0 | 1 | 2 | 3 | 4 | 5 | 6 | 7 |
| 0 | 0 | 0 | 0 | 0 | 0 | 0 | 0 | 0 |
| 1 | 1 | 1 | 1 | 1 | 1 | 1 | 1 | 1 |
| 2 | 0 | 0 | 0 | 0 | 0 | 0 | 0 | 0 |
| 3 | 1 | 1 | 1 | 1 | 1 | 1 | 1 | 1 |
| 4 | 0 | 0 | 0 | 0 | 0 | 0 | 0 | 0 |
| 5 | 1 | 1 | 1 | 1 | 1 | 1 | 1 | 1 |
| 6 | 0 | 0 | 0 | 0 | 0 | 0 | 0 | 0 |
| 7 | 1 | 1 | 1 | 1 | 1 | 1 | 1 | 1 |

METHOD AND SYSTEM FOR RE-ORDERING BITS IN A MEMORY SYSTEM

FIELD OF THE INVENTION

The present invention relates generally to DRAM memory systems and more specifically to a method and system for determining the reordering of bits within the system.

BACKGROUND OF THE INVENTION

In a DRAM system, the DQ bits within a nibble or byte can be re-ordered to help board routing and system integration issues. The dual inline memory modules (DIMM) specification and DRAM specification groups have created a situation where it is difficult to provide system integration without adding cost to the system. As of now there are no re-ordering restrictions and there are no defined re-ordering methodologies. Additionally, the re-ordering within each byte can be unique, and the re-ordering for each rank can be different. With features like CRC (Cyclic Redundancy Check), the order of the data is significant. The CRC algorithm relies on a specific bit order and will not function correctly if the DRAM and system-on-a chip (SoC) do not create the CRC bits based on the same DQ order. There are several conventional solutions to this issue. They are described below:

1. Do not allow bits within a byte to be reordered. This will require all double data rate 4 (DDR4) DIMM and board manufacturers to never re-order DQ bits; any vendor who does not adhere to this rule will create an incompatibility issue. This will also limit the ability of these vendors to optimally route the DQ bus to minimize system integration issues, which will limit the maximum achievable frequency of a system and/or maximum loading of a system. The maximum loading will limit the maximum DRAM density that can be utilized.

2. Limit DQ re-ordering to a defined subset. This will also require all DDR4 DIMM and board vendors to adhere to this limitation; any vendor who does not will create an incompatibility issue. For a system provider, this scenario is not attractive. Additionally, predefining the re-ordering will limit what can be done to minimize SI issues.

3. Use a serial presence detect device (storage element) on the DIMM to store the bit reordering for all DRAM devices on the DIMM. Each 8-bits on each rank can be re-ordered. A DIMM is typically 64-bits wide and can have up to 4 ranks of memory. This scenario has 32 unique sets of 8 DQ bits that could be reordered. The reordering can be unique for each set. Consequently the amount of storage to hold the reordering information is large and may require a larger storage element (EEPROM, etc.). A larger storage device will add to the overall cost of a system.

Additionally, reordering can occur on non-DIMM systems based on the routing between the DDR4 device and the SoC. In this scenario, an SPD device does not exist and would be very costly to add to the system. A solution that can be implemented to the satisfaction of DRAM, DIMM, and System vendors alike has not been provided.

DDR DIMM (Dual-Inline Memory Modules) commonly reorder the bits within a byte lane for better signal integrity. While no specific proposals for DDR4 DIMMs have been made yet, it is expected that DDR4 DIMM manufacturers will want to be able to reorder the DRAM bits within each byte lane for better signal integrity. Further, the SoC package or the printed circuit board (PCB) designer may also wish to reorder DRAM bits within a byte lane for signal integrity purposes. Consequently, the SoC must understand how the DQ bits are routed and potentially re-ordered from the SoC output to the DRAM inputs. Accordingly what is desired is a system and method for providing re-ordering of the bits provided to a memory system that addresses the above identified issues. The system and method should cost effective, easily implemented and adaptable to existing environments.

The present invention addresses such a need.

SUMMARY OF THE INVENTION

A method and system for re-ordering bits in a memory system is disclosed. The memory system includes a system on a chip (SoC) coupled to a plurality of memory chips. Each of the memory chips including a memory array, multipurpose registers (MPRs) coupled to the memory array; and a data bus coupled between the SoC and the memory array. The method and system comprise utilizing the MPRs within each of the plurality of memory chips to determine bit ordering within each byte lane of memory array of the associated memory chip. The method and system further includes providing the determined bit ordering to the SoC.

BRIEF DESCRIPTION OF THE DRAWINGS

FIG. 4B is a table in accordance with an embodiment of FIG. 4A where the MPR value of the loop iteration is 'b000_0100.

FIG. 5B is a table in accordance with the second embodiment illustrating a read of MPR0.

DETAILED DESCRIPTION

The present invention relates generally to DRAM memory systems and more specifically to a method and system for determining the reordering of bits within the system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
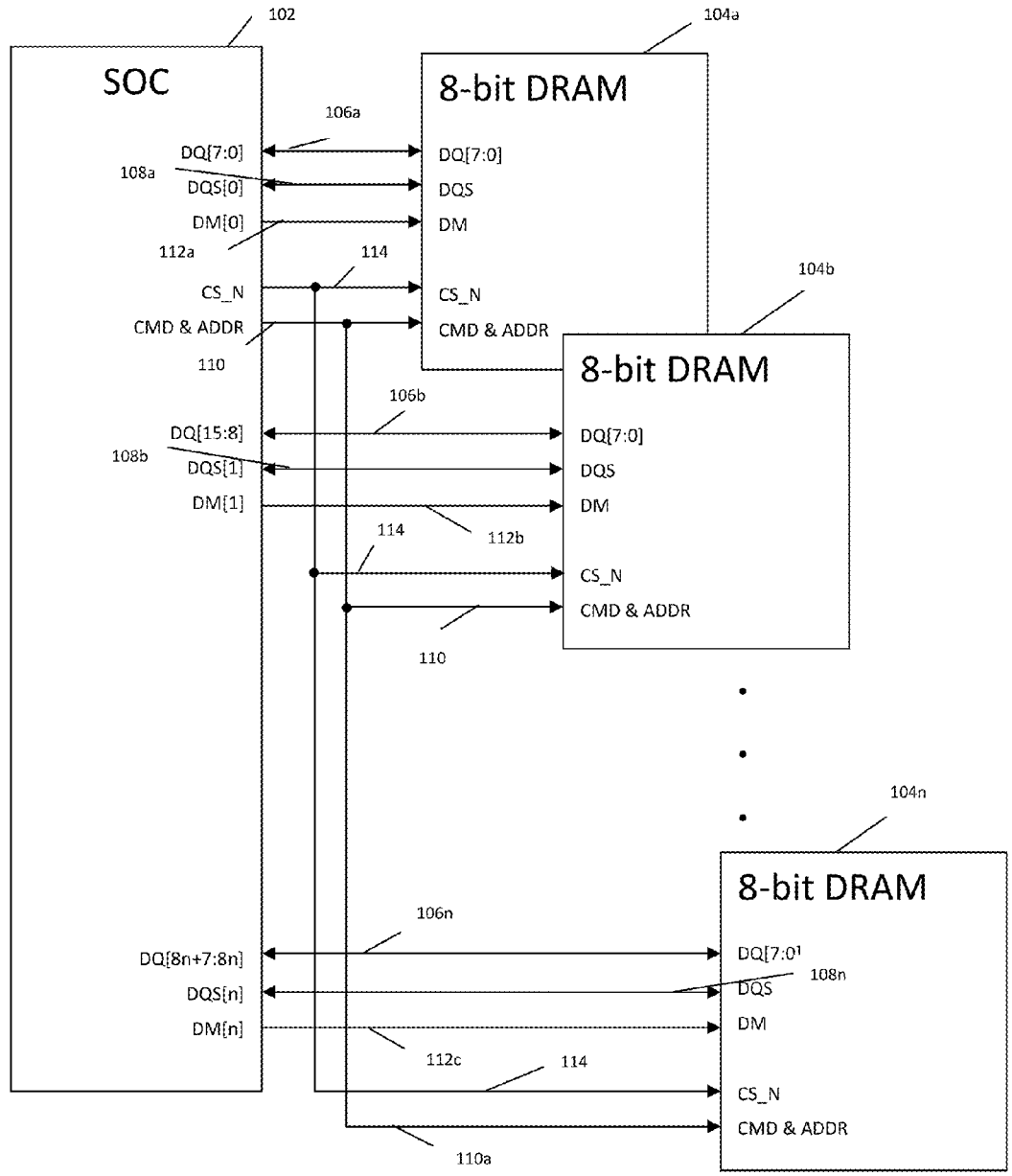
FIG. 1 is a simple block diagram of a DDR4 memory system in accordance with an embodiment.

FIG. 1 is a simple block diagram of a double data rate 4 (DDR4) memory system 100 in accordance with an embodiment. Although the method and system in accordance with the present invention will be discussed on the context of a DDR4 memory system one of ordinary skill in the art will readily recognize that many other types of memory system could be utilized and that use would be within the spirit and scope of the present invention. The DDR4 system 100 includes a system-on-a-chip (SoC) 102 which is coupled to a plurality of 8-bit DRAM chips 104a-104n. Although 8-bit DRAM chips 104a-104n are shown, one of ordinary skill in the art recognizes that a system and method in accordance with the present invention is not so limited. Accordingly, the DRAM chips 104a-104n can be any size and their use would be within the spirit and scope of the present invention. The SoC 102 communicates with the plurality of DRAM chips 104a-104n. The SoC 102 is coupled to each of the DRAM chips 104a-104n via DQ output bus 106a-106n and DQS lines 108a-108n. A command and address (CMD & ADDR) bus 110 from the SoC 102 provides address, bank, bank group, and command signals as defined by the DRAM protocol.

In an embodiment an algorithm is executed within the SoC 102 to automatically detect the bit ordering. A series of commands are sent by the SoC 102 to the DRAM chips 104a-104n for bit re-ordering training. The set of commands used for bit reordering training includes one or more of the following: Write Commands, Read Commands, and multi-purpose register (MPR) accesses. During normal operation, a CRC error bit on the DDR4 system 100 will never be asserted; a CRC error assertion is an indication of a serious malfunction in the signal path between the SoC 102 and the DRAM chips 104a-104n.

The algorithm utilizes the MPRs in the DDR4 system 100 to reduce the number of cycles required to determine bit ordering. The MPRs, when enabled, will return a defined pattern on the DQ bus 106 and is traditionally used for gate training and for read DQS/DQ training. The advantage of this solution is that it requires no additional hardware, thereby reducing cost. Furthermore this solution will work with any DDR4 DIMM or board, regardless of the vendor. Finally in utilizing this solution incompatibility issues are minimized. The DDR4 system 100 can still route DQ bits without restriction in order to minimize system integration issues. Reducing system integration issues allows for systems to run at higher speeds and/or with more loads (higher densities.) Since the training is only required to be done once, the overhead of the bit reordering training is only seen at power-up and the delay incurred is minimal. Consequently, a low cost solution is provided that is flexible and allows functionality in a variety of DDR4 systems.

A method and system for detecting the bit re-ordering of data in a memory system is disclosed. Embodiments described herein can take the form of an entirely hardware implementation, an entirely software implementation, or an implementation containing both hardware and software elements. Embodiments may be implemented in software, which includes, but is not limited to, application software, firmware, resident software, microcode, etc.

The steps described herein may be implemented using any suitable controller or processor, and software application, which may be stored on any suitable storage location or computer-readable medium. The software application provides instructions that enable the processor to cause the receiver to perform the functions described herein.

Furthermore, embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read—only memory (CD-ROM), and compact disk—read/write (CD-R/W). To describe the features of the present invention in more detail refer now to the following description in conjunction with the accompanying Figures.

Figure 2:
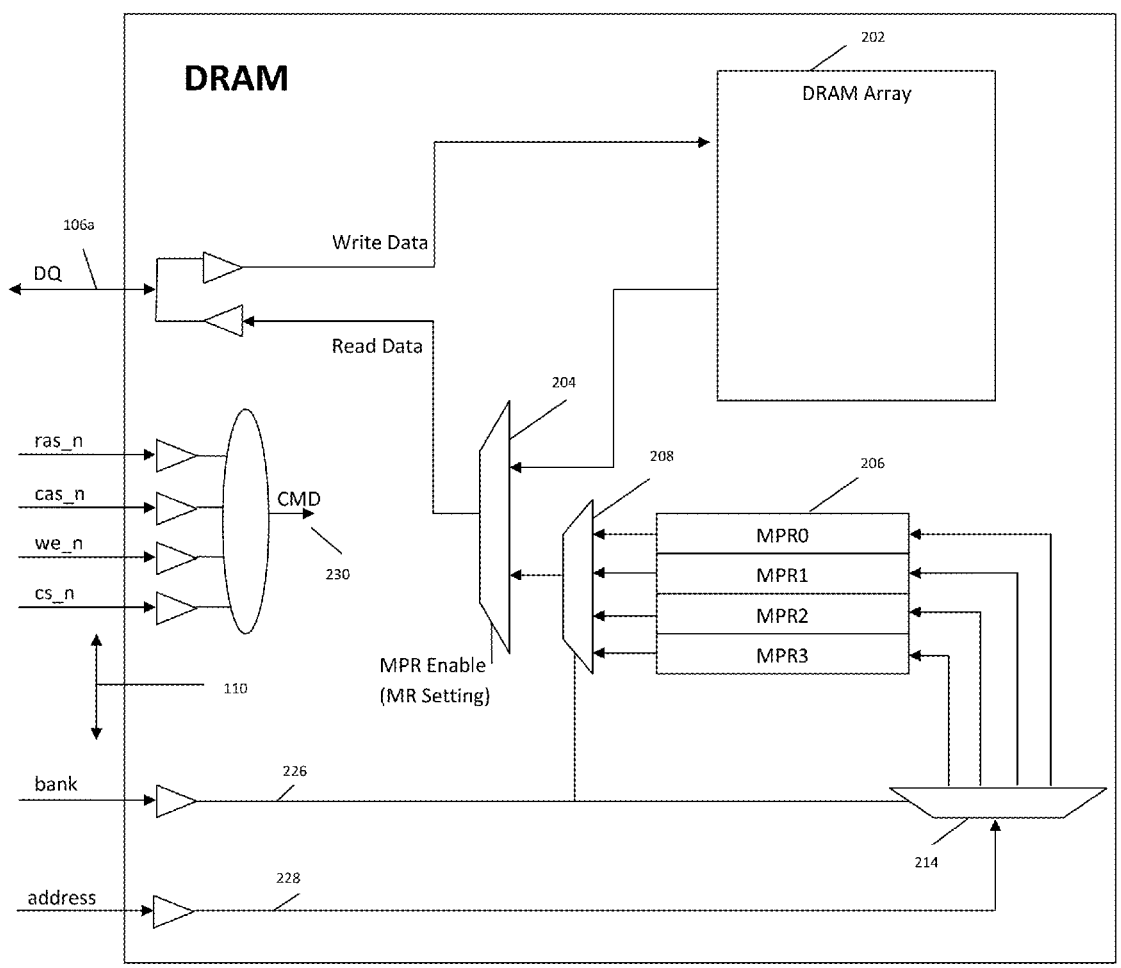
FIG. 2 is a simplified block diagram of one DRAM chip which is part of the DDR4 memory system in accordance with the present invention.

FIG. 2 is a block diagram of a diagram of one DRAM chip 104 which is part of system 100 in accordance with the present invention. The DRAM chip 104 includes a DRAM array 202 which is coupled to a first multiplexer 204. Data is written to the DRAM array 202 via the DQ bus 106. The DRAM chip 104 includes MPRs (MPR0-MPR3) 206 coupled to inputs of a second multiplexer 208. It should be recognized that four MPRs are shown there could be any number of MPRs utilized within the DRAM chip 104 and the use would be within the spirit and scope of the present invention.

The second multiplexer 208 provides an output signal to one of the inputs of the first multiplexer 204. The bank inputs 226 which may include bank group inputs and the address inputs 228 are coupled to a de-multiplexer 214. The de-multiplexer 214 is coupled to the second multiplexer 208.

The DQ bus 106 is enabled after the command inputs ras_n, cas_n, we_n, and cs_n are decoded as a read command (delay from command to DQ bus active is dependent on device and frequency). The DQ output bus 106 will transmit the MPR values when the second multiplexer 208 is enabled via a mode register setting. The bank inputs 226 of the read command select the MPR value (MPR0, 1, 2, or 3) that will be driven on the DQ output bus 106. Depending on the MPR read format, the data will either change per unit interval or per DQ.

Mode Register Write

Figure 3:
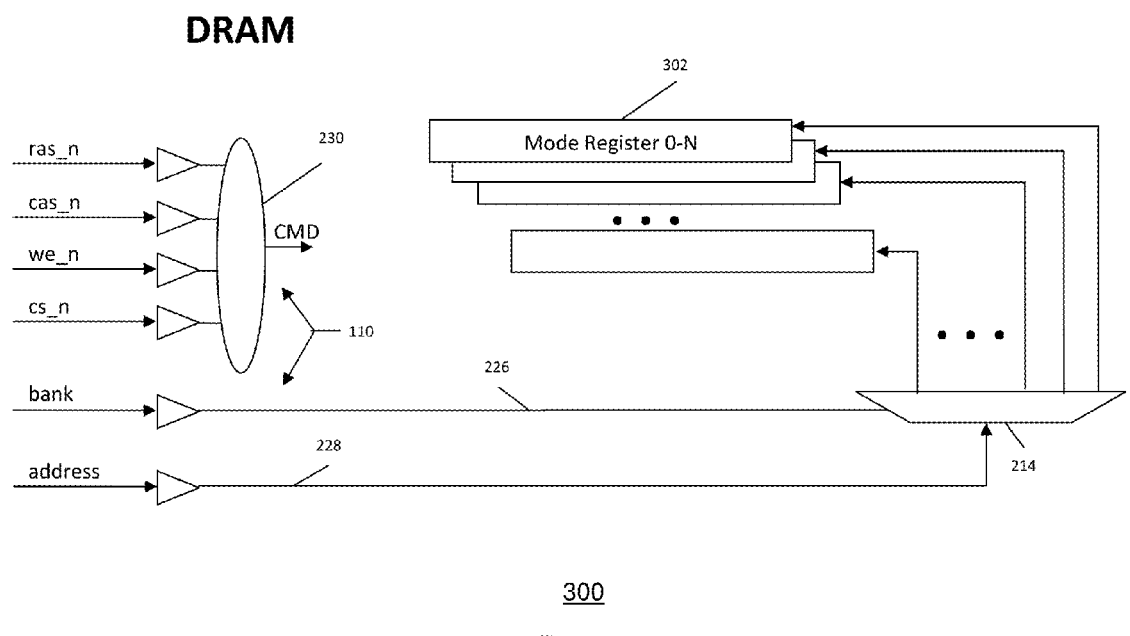
FIG. 3 is a block diagram of a mode register write configuration.

FIG. 3 is a block diagram of a mode register write configuration of the DRAM chip 104. The mode register data is written when the command inputs (ras_n, cas_n, we_n, and cs_n) are decoded as a mode register write command. The bank inputs 226 of the write command determine the mode register location that will be updated. The bank inputs 226 may include bank group inputs. The address inputs 228 define the value to be written to the mode register 302.

The MPR data is written when the de-multiplexer 214 is enabled via a mode register setting and the command inputs (ras_n, cas_n, we_n, and cs_n) are decoded as a write command. The bank inputs 226 of the write command determine the MPR location that will be updated. The address inputs 228 define the value to be written to the MPRs 206. The MPR values are updated when the required DRAM delay is met after the MPR write command.

Determining DQ Order within a DDR4 DRAM System

In the DDR4 system 100, the DQ bits within a byte can be re-ordered to help board routing and system integration issues. There are no re-ordering restrictions and there are no defined re-ordering methodologies. Additionally, the re-ordering within each byte can be unique, and the re-ordering for each rank can be different. With features like CRC (Cyclic Redundancy Check), the order of the data is significant. Referring again to FIG. 1, the CRC algorithm relies on a specific bit order and will not function correctly if the DRAM chips 104a-104n and the SoC 102 do not create the CRC bits based on the same DQ order. Consequently, the SoC 102 must understand how the DQ bits are routed and potentially re-ordered from the SoC 102 output to the DRAM chip 104a-

104*n* inputs. The following description and the accompanying Figures illustrate methods to determine the DQ bit re-ordering.

Figure 4A:
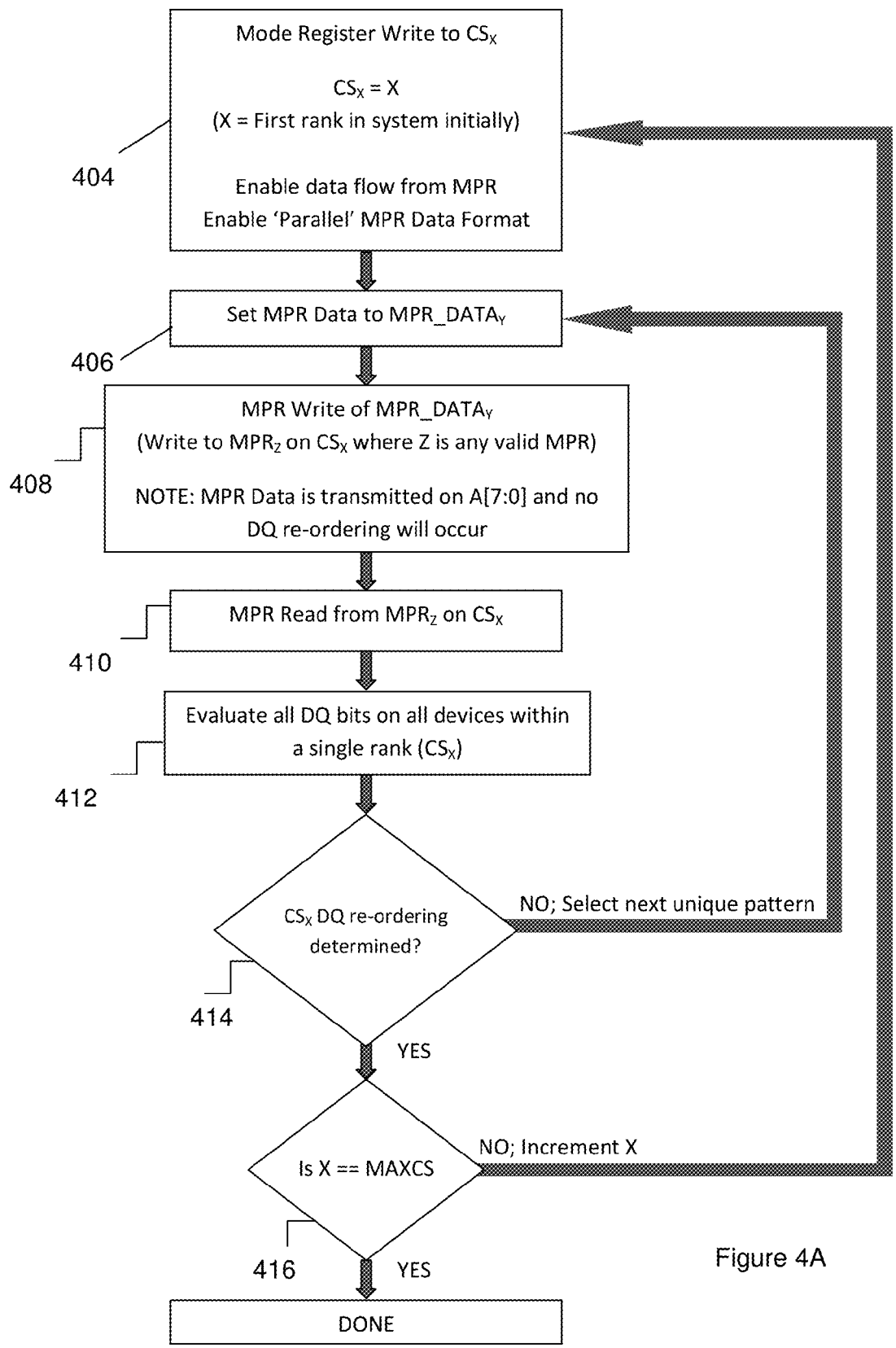
FIG. 4A is a flow chart of a first embodiment of a process for determining the bit re-ordering in accordance with the present invention.

FIG. 4A is a flow chart of a first embodiment of a process for re-ordering the bits in accordance with the present invention. Referring to FIGS. 1-4A together, first, the mode register 302 write is issued to $CS_X$ 114, where X is the first in rank initially, via step 404. At this step the data flow, a 'Parallel' MPR Data Format and MPR page 0 is enabled. Then, the MPR data is set, via step 406. Next, $MPR\_DATA_y$ is written to $MPR_Z$ on $CS_X$ 114, via step 408. (Note: MPR Data is transmitted on A[7:0] and no DQ re-ordering will occur.) Next, the MPR value is read from $MPR_Z$ on the $CS_X$ 114, via step 410. The $MPR\_DATA_y$ value is a unique bit pattern per loop. The unique bits within $MPR\_DATA_y$ are used to determine the mapping of $MPR\_DATA_y$ to the bit order within one or more iteration of the loop 406-414.

Thereafter, the DQ bus 106 is evaluated for all devices in a single rank of the DRAM chip 104, via step 412. It is then determined if all of the DQ bits have been evaluated, via step 414. If all of the DQ bits within the rank have not been evaluated, then increment to the next value of the MPR data and return to step 406. Steps 406-414 are repeated until the bit order for all DQ bits 106*a*-106*n* on $CS_X$ have been determined. Steps 404-414 are repeated until the bit order on all chips 104 within the system is determined. The process ends once the bit order between the SoC 102 and each of the DRAM devices 104*a*-104*n* has been determined for all ranks.

In this process, the MPRs 206 are utilized to determine the DQ bit re-ordering within each byte. This algorithm can be performed quickly during initialization, with the DQ ordering across an entire rank determined in a minimal number of cycles. The parallel mode of the MPRs 206 will be utilized to quickly determine the bit re-ordering for all byte lanes simultaneously, without requiring write DQS or DQ training. With the parallel MPR format, MPR data is returned, in parallel, across the DQ bus 106. This is illustrated in the table of FIG. 4B where:

MPR Value=>'b0000_0100

This table illustrates how the MPR value, in a parallel format, is used to determine the bit re-ordering. Any unique pattern or set of unique patterns could be used.

Figure 5A:
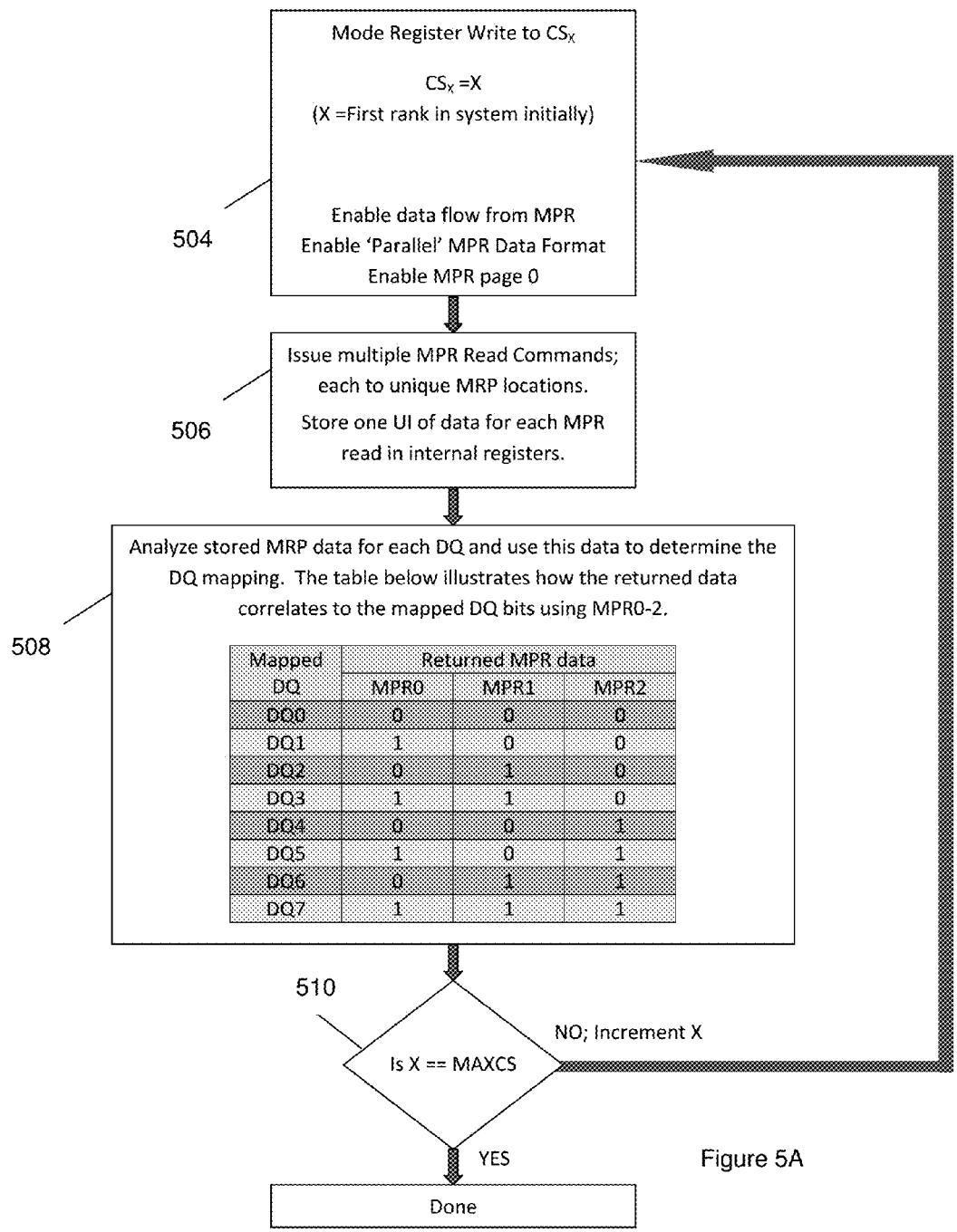
FIG. 5A is a flow chart of a second embodiment of a process for re-ordering the bits in accordance with the present invention.

FIG. 5A is a flow chart of a second embodiment of a process for re-ordering the bits in accordance with the present invention. This embodiment is a modified version of the embodiment of FIG. 4A. In this embodiment, at least three MPR read commands are issued; one to each MPR location, MPR0-MPR2, via step 506. In this step, one unit interval (UI) of data is stored for each MPR read in internal registers. Next, the stored MPR data for each DQ is analyzed and this data is used to determine the DQ mapping, via step 508. The table in step 508 illustrates how the returned data correlates to the mapped DQ bit. Once the bit order is determined for all DRAM devices 104*a*-104*n* on all ranks via step 510, (X=MAXCS), the process then ends.

With this MPR format, all of the MPR data values are returned, in parallel, across the DQ bus.

FIG. 5B is a table in accordance with the second embodiment.

Default values within each of the MPR locations:
MPR0 Value=>'b0101_0101
MPR1 Value=>'b1100_1100
MPR2 Value=>'b1111_0000
MPR3 Value=>'b0000_0000

FIG. 5B illustrates how the default MPR values are returned in a parallel format, using MPR0 as an example. The default MPR values are used to determine the bit re-ordering.

The algorithm of FIG. 5A is a more efficient algorithm than that of FIG. 4A. The algorithm of FIG. 4A requires for example in this embodiment multiple MPR read and multiple MPR write commands per chip. The algorithm of FIG. 5A a minimum of 3 MPR reads per chip.

Figure 6:
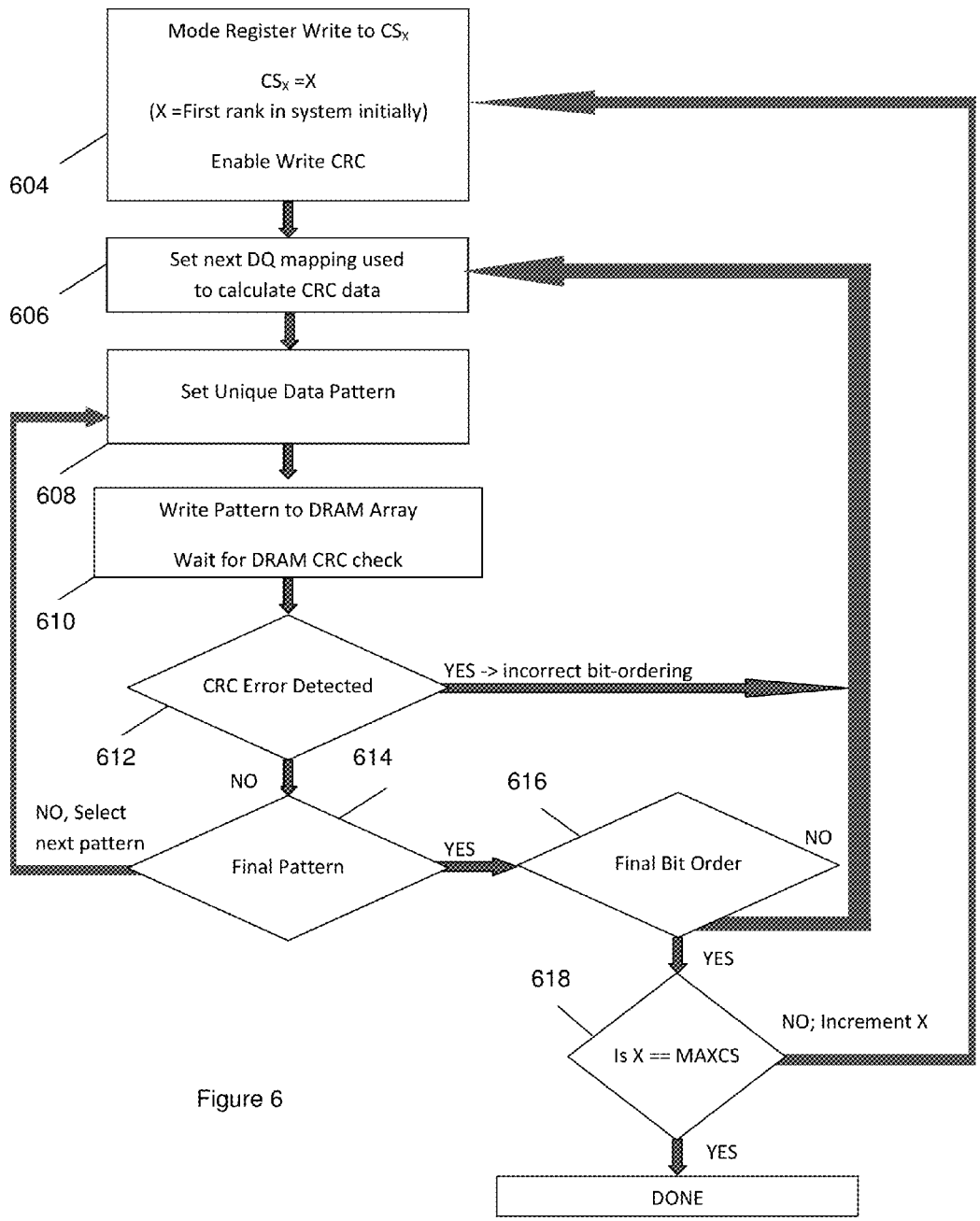
FIG. 6 is a flow chart of a third embodiment of a process for re-ordering the bits in accordance with the present invention.

In another embodiment, an algorithm is provided that utilizes the CRC process to determine the proper reordering. FIG. 6 is a flow chart of a third embodiment of a process for re-ordering the bits in accordance with the present invention. Referring to FIGS. 1-3 and 6 together, the mode register write is issued to $CS_X$ 114, via step 604. This enables writing a cyclic redundancy code (CRC). Then, the first DQ mapping (bit order) is set and used to calculate the CRC data, via step 606. Thereafter a unique data pattern is set, via step 608. The data pattern is then written to the DRAM array 202, via step 610 and then a CRC check is performed. If a CRC error is detected, via step 612 the bit order is incorrect. If the bit order is incorrect, select the next DQ mapping (bit order) and return to step 606.

Returning to step 612, if a CRC error is not detected then it is determined if this is the final data pattern. If it is not the final data pattern, select the next unique pattern and return to step 608. If it is the final data pattern then return to step 616 where it is determined if this is the final DQ mapping (bit order). If it is not the final bit order, select the next DQ mapping (bit order) and return to step 606. If it is the final bit order, then it is determined if this is the last memory chip 202 (X=MAXCS), via step 618. If no, increment to the next memory (X) and return to step 604.

Write commands to the DRAM 104 will be utilized to determine the DQ bit re-ordering within each byte. These write commands are issued with CRC enabled. The DRAM will return an error when the generated CRC is not correct, which could occur due to DQ bit remapping. The SoC 102 will analyze the error status returned to determine the correct DQ mapping. This algorithm can be performed during initialization and will iterate across different re-ordering combinations. The algorithm in one embodiment iterates across all DQ re-ordering combinations. Depending on the starting pattern, the number of required iterations could be reduced.

With x8 and x16 devices, the CRC algorithm is applied across 72-bits. These bits correspond to 8 unit intervals of data, with each unit interval comprised of 8-bits for DQ and 1-bit for data bit inversion (DBI_N). The 8-bits of the DQ are the bits that could be re-ordered. The MAX number of reordering possibilities is 8!=40,320.

With x4 devices, the CRC algorithm is applied across 32-bits of data, with an additional 40-bits hardcoded to 1. The data bits correspond to 8 unit intervals of data, with each unit interval including 4-bits for DQ, which could be re-ordered. The MAX number of reordering possibilities is 4!=24.

In accordance with an embodiment a consistent data pattern will be applied across each byte lane (nibble for x4 devices). This data pattern will be written to memory for each DQ re-ordering possibility. The error returned will be used to determine which re-ordering combinations are not valid. Once the data pattern has been written to memory for all re-ordering combinations, a new data pattern will be selected and process will be repeated. This process will continue until there is only one possible re-ordering combination that does not result in an error for all patterns.

Advantages

When utilizing any of the above identified processes, DIMM, Package and PCB designers may reorder the bits within each byte lane to achieve optimal signal integrity. There is no additional cost or effort required on the part of these suppliers. Accordingly a system and method in accordance with the present invention provides a cost effective and efficient solution for the re-ordering of the bit utilizing this type of memory system.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for bit re-ordering in a memory system, the memory system including a system on a chip (SoC) coupled to a plurality of memory chips; each of the plurality of memory chips including a memory array, multipurpose registers (MPRs) coupled to the memory array; and a data bus coupled between the SoC and the memory array; the method comprising:

utilizing a parallel mode of the MPRs to determine the bit re-ordering for all byte lanes of the plurality of memory chips, wherein the parallel mode increments to a next value of MPR data until all bits within one of the plurality of memory chips are evaluated, wherein the parallel mode repeats until each of the plurality of memory chips are evaluated; and providing the determined bit re-ordering to the SoC.

2. The method of claim 1, wherein at least one value within one of the MPRs is returned in parallel across the data bus.

3. The method of claim 1, wherein values within all of the MPRs are returned in parallel across the data bus.

4. The method of claim 1, wherein the memory system comprises a double data rate 4 (DDR4) memory system, the data bus comprises a DQ bus and the memory chips are 8-bit DRAM chips.

5. A memory system comprising;

a plurality of memory chips; each of the plurality of memory chips including a memory array, multipurpose registers (MPRs) coupled to the memory array; and a data bus; and a system on a chip (SoC) coupled to the plurality of memory chips and coupled to the data bus; wherein the SoC includes a mechanism for utilizing a parallel mode of the MPRs to determine the bit re-ordering for all byte lanes of the plurality of memory chips, wherein the parallel mode increments to a next value of MPR data until all bits within one of the plurality of memory chips are evaluated, wherein the parallel mode repeats until each of the plurality of memory chips are evaluated; and for providing the determined bit re-ordering to the SoC.

6. The memory system of claim 5, wherein at least one value within one of the MPRs is returned in parallel across the data bus.

7. The memory system claim 5, wherein values within all of the MPRs are returned in parallel across the data bus.

8. The memory system claim 5, wherein the memory system comprises a double data rate 4 (DDR4) memory system, the data bus comprises a DQ bus and the memory chips are 8-bit DRAM chips.

9. A non-transitory computer readable medium containing program instructions for re-ordering bits in a memory system, the memory system including a system on a chip (SoC) coupled to a plurality of memory chips; each of the plurality of memory chips including a memory array, multipurpose registers (MPRs) coupled to the memory array; and a data bus coupled between the SoC and the memory array; the program instructions which when executed by a computer system cause the computer system to execute a method comprising:

utilizing a parallel mode of the MPRs to determine the bit re-ordering for all byte lanes of the plurality of memory chips, wherein the parallel mode increments to a next value of MPR data until all bits within one of the plurality of memory chips are evaluated, wherein the parallel mode repeats until each of the plurality of memory chips are evaluated; and providing the determined bit re-ordering to the SoC.

10. The computer readable medium of claim 9, wherein at least one value within one of the MPRs is returned in parallel across the data bus.

11. The computer readable medium of claim 10, wherein values within all of the MPRs are returned in parallel across the data bus.

12. The computer readable medium of claim 9, wherein the memory system comprises a double data rate 4 (DDR4) memory system, the data bus comprises a DQ bus and the memory chips are 8-bit DRAM chips.

* * * * *